(12) United States Patent
Grivna et al.

(10) Patent No.: US 10,090,199 B2
(45) Date of Patent: Oct. 2, 2018

(54) SEMICONDUCTOR DEVICE AND METHOD FOR SUPPORTING ULTRA-THIN SEMICONDUCTOR DIE

(71) Applicant: SEMICONDUCTOR COMPONENTS INDUSTRIES, LLC, Phoenix, AZ (US)

(72) Inventors: Gordon M. Grivna, Mesa, AZ (US); Stephen St. Germain, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/446,281

(22) Filed: Mar. 1, 2017

(65) Prior Publication Data

US 2018/0254217 A1    Sep. 6, 2018

(51) Int. Cl.
*H01L 21/78*    (2006.01)
*H01L 21/02*    (2006.01)
(Continued)

(52) U.S. Cl.
CPC ...... *H01L 21/7806* (2013.01); *H01L 21/0254* (2013.01); *H01L 21/02381* (2013.01);
(Continued)

(58) Field of Classification Search
CPC ... H01L 21/304; H01L 21/78; H01L 33/0095; H01L 2221/68327; H01L 21/2007;
(Continued)

(56) References Cited

U.S. PATENT DOCUMENTS

| 2003/0032216 A1* | 2/2003 | Nakaoka | H01L 29/0657 |
| | | | 438/106 |
| 2010/0006864 A1* | 1/2010 | Steigerwald | H01L 25/167 |
| | | | 257/88 |
| 2014/0210054 A1* | 7/2014 | Kosub | H01L 23/5389 |
| | | | 257/618 |

OTHER PUBLICATIONS

Ralf Lerner et al., "Integration of GaNHEMTSs into Silicon CMOS by Micro Transfer Printing," Proceedings of the 2016 28th International Symposium on Power Semiconductor Devices and ICs (ISPSD), IEEE, 2016, pp. 451-454.
(Continued)

*Primary Examiner* — Sonya D McCall Shepard
(74) *Attorney, Agent, or Firm* — IPTechLaw

(57) ABSTRACT

A first semiconductor substrate contains a first semiconductor material, such as silicon. A second semiconductor substrate containing a second semiconductor material, such as gallium nitride or aluminum gallium nitride, is formed on the first semiconductor substrate. The first semiconductor substrate and second semiconductor substrate are singulated to provide a semiconductor die including a portion of the second semiconductor material supported by a portion of the first semiconductor material. The semiconductor die is disposed over a die attach area of an interconnect structure. The interconnect structure has a conductive layer and optional active region. An underfill material is deposited between the semiconductor die and die attach area of the interconnect structure. The first semiconductor material is removed from the semiconductor die and the interconnect structure is singulated to separate the semiconductor die. The first semiconductor material can be removed post interconnect structure singulation.

20 Claims, 9 Drawing Sheets

(51) Int. Cl.
*H01L 21/48* (2006.01)
*H01L 29/20* (2006.01)
*H01L 23/495* (2006.01)

(52) U.S. Cl.
CPC .......... *H01L 21/4825* (2013.01); *H01L 21/78* (2013.01); *H01L 23/49562* (2013.01); *H01L 29/2003* (2013.01)

(58) Field of Classification Search
CPC .......... H01L 21/76251; H01L 33/0079; H01L 2221/68331; H01L 2221/68336
See application file for complete search history.

(56) References Cited

OTHER PUBLICATIONS

Ali Salih, "Electronic Device and a Process for Forming the Same," U.S. Appl. No. 15/225,607, filed Aug. 1, 2016, 39 pages.

* cited by examiner

SEMICONDUCTOR DEVICE AND METHOD FOR SUPPORTING ULTRA-THIN SEMICONDUCTOR DIE

FIELD OF THE INVENTION

The present invention relates in general to semiconductor devices and, more particularly, to a semiconductor device and method for providing support for an ultra-thin semiconductor die, such as gallium nitride or aluminum gallium nitride based die, during integration and manufacture processing.

BACKGROUND

A semiconductor wafer or substrate can be made with a variety of base substrate materials, such as silicon (Si), germanium, aluminum nitride (AlN), gallium arsenide (GaAs), gallium nitride (GaN), aluminum gallium nitride over gallium nitride (AlGaN/GaN), indium phosphide, silicon carbide (SiC), or other bulk semiconductor material for structural support. In particular, GaN is a binary III/V direct bandgap semiconductor material with properties of hardness (12±2 GPa), mechanically stable wide bandgap (3.4 eV), and high heat capacity and thermal conductivity. GaN and AlGaN/GaN can be doped with Si, or with oxygen to n-type and with magnesium (Mg) to p-type. The wide band gap allows the performance of GaN devices to be maintained up to higher temperatures (400° C.) than Si devices (150° C.) with lesser effects of thermal generation of charge carriers that are inherent to semiconductors. The high breakdown voltage, high electron mobility, and saturation velocity of GaN and AlGaN/GaN are suitable for high voltage, high power, high frequency, high temperature, and radiation applications. GaN and AlGaN/GaN is also widely used in optoelectronics and other applications requiring low resistance and low energy consumption.

A GaN or AlGaN/GaN semiconductor wafer or substrate (collectively referred to as GaN substrate) is commonly grown by atomic layer deposition to build up a GaN lattice structure on a thick Si wafer. Special care must be exercised during the manufacturing process to avoid cracking, breakage, or other structural damage to the GaN semiconductor substrate. To reduce stress and cost of the GaN lattice structure, it is typically made ultra-thin, on the order of 10-50 micrometers ($\mu m$).

The supporting Si tends to reduce the breakdown voltage of the GaN device, which is counter to the desired properties described above. The GaN substrate is often made thicker to compensate, which adds cost and stress factors. However, a higher breakdown for the GaN substrate would negate the need for a thicker GaN substrate to decrease cost and stress factors. To meet the breakdown voltage target, the Si wafer and Si layer must be removed before the final GaN device is realized. Due to the difficulty and expense of removing the silicon wafer, in most cases the silicon wafer is retained and the device performance suffers. In cases where the Si support is removed, the step is performed at the wafer-level, before with singulation of the GaN substrate. However, after silicon substrate removal, the ultra-thin GaN die are susceptible to cracking, breakage, or other structural damage during the subsequent device integration and packaging process.

In another micro transfer printed process, the GaN substrate is again grown by atomic layer deposition to build up a GaN lattice structure on a thick first Si wafer. A stamped wafer includes a plurality of protrusions on a bottom surface of the stamped wafer, matching one-for-one with the GaN die on the GaN substrate. The GaN die are undercut by an etching process to singulate the GaN substrate and then lifted off by contacting the protrusions of the stamped wafer to separate from the first Si wafer. The GaN die no longer have the support of the first Si wafer. The individual GaN die, as supported now by the stamped wafer, are transferred to and placed active surface oriented up on a second Si wafer. An interconnect structure is formed and routed from the second Si wafer up and over the active surface of the GaN die. Again, the first Si support is removed at the wafer-level, before or simultaneous with singulation of the GaN substrate. The protrusions of the stamped wafer provides limited stability and support and may not properly pick-up all GaN die. In addition, forming the interconnect structure from the second Si wafer up and over the active surface of the GaN die can lead to cracking, breakage, or other structural damage.

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Figure 1A:
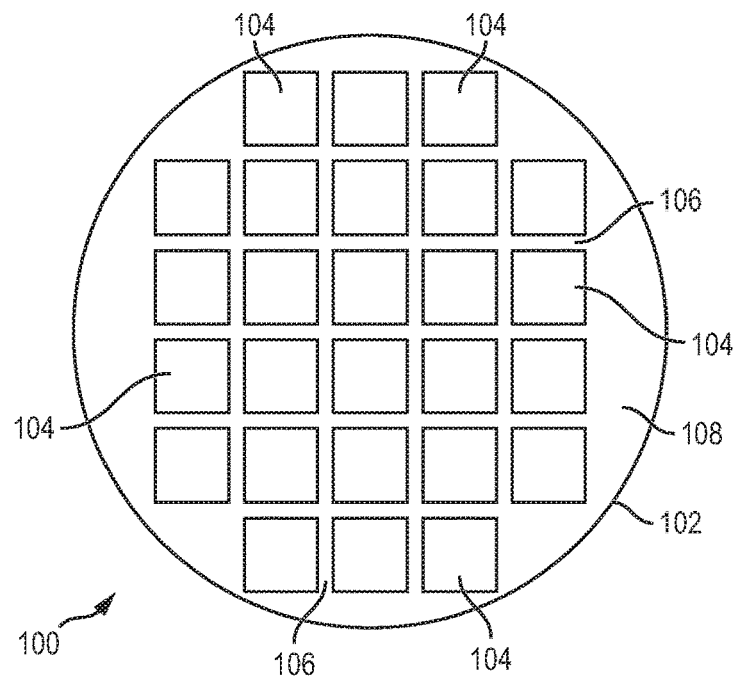
FIGS. 1a-1c illustrate a GaN semiconductor substrate with a plurality of semiconductor die separated by a saw street.

FIG. 1a shows a semiconductor wafer or substrate 100 with a base substrate material 102, such as Si, germanium, AlN, GaAs, GaN, AlGaN/GaN, indium phosphide, SiC, or other bulk semiconductor material for structural support. In one embodiment, a GaN or AlGaN/GaN wafer or substrate 108 (hereinafter referred to as GaN substrate) is grown by atomic layer deposition to build up a GaN lattice structure on the thick Si base substrate material 102. Alternatively, a GaAs wafer or substrate is formed on Si base substrate material 102, or a SiC wafer or substrate is formed on Si base substrate material 102. A plurality of GaN semiconductor die 104 is formed on GaN substrate 108 separated by a non-active, inter-die substrate area or saw street 106. Saw street 106 provides cutting areas to singulate semiconductor substrate 100 into individual GaN semiconductor die 104. In one embodiment, semiconductor substrate 100 has a width or diameter of 100-450 millimeters (mm) and overall thickness of about 800 $\mu m$, with a GaN substrate thickness of about 10-50 $\mu m$.

Figure 1B:
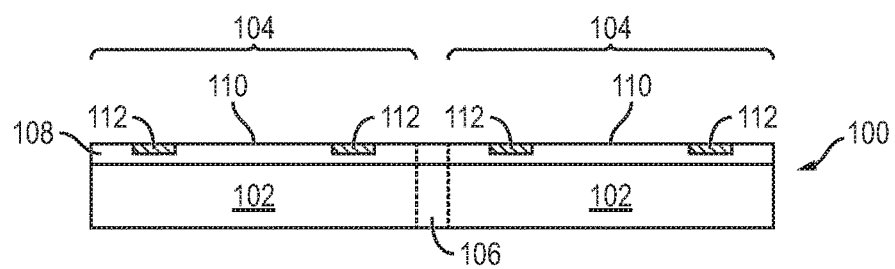

FIG. 1b shows a cross-sectional view of a portion of semiconductor substrate 100, including supporting base substrate material 102 and GaN substrate 108. The thick base substrate material 102 provides structural support for GaN substrate 108 during wafer-level processes and handling, and as will be seen later for die-level processes and handling. Each GaN semiconductor die 104 is formed with an active surface or region 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface or region 110 to implement analog circuits or digital circuits in high voltage, high power, high frequency, high temperature, and radiation applications. In one embodiment, GaN semiconductor die 104 implements a power metal oxide semiconductor field effect transistor (MOSFET) or power complementary metal oxide semiconductor (CMOS) transistor for an RF application. GaN semiconductor die 104 may also contain a digital signal processor (DSP), microcontroller, ASIC, standard logic, amplifiers, clock management, memory, interface circuit, optoelectronics, and other signal processing circuits that can provide low resistance and low energy consumption. GaN semiconductor die 104 may also contain integrated passive devices (IPDs), such as inductors, capacitors, and resistors, for RF signal processing.

An electrically conductive layer 112 is formed over or on active surface 110 using PVD, CVD, electrolytic plating, electroless plating process, or other suitable metal deposition process. Conductive layer 112 includes one or more layers of aluminum (Al), copper (Cu), tin (Sn), nickel (Ni), gold (Au), silver (Ag), titanium (Ti), titanium tungsten (TiW), or other suitable electrically conductive material. Conductive layer 112 operates as contact pads electrically connected to the circuits, e.g. gate region, drain region, and source region of the power MOSFET, on active surface 110.

Figure 1C:
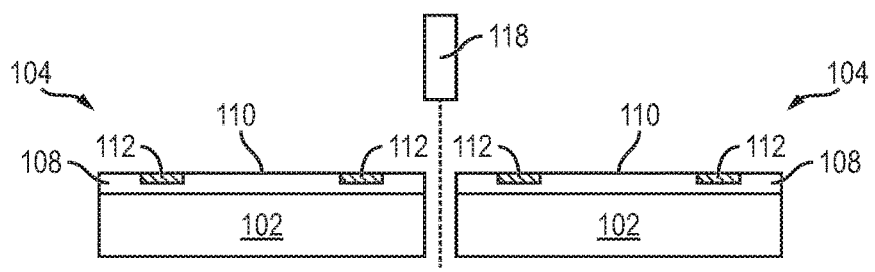

In FIG. 1c, semiconductor substrate 100 is singulated through saw street 106 using a saw blade or laser cutting tool 118 into individual GaN semiconductor die 104. Alternatively, semiconductor substrate 100 is singulated by plasma etching. Plasma etching has advantages of forming precision side surfaces along saw streets 106, while retaining the structure and integrity of the base substrate material. GaN semiconductor die 104 remain affixed to base substrate material 102 post singulation for structural support during subsequent integration and manufacturing processes.

Figure 2A:
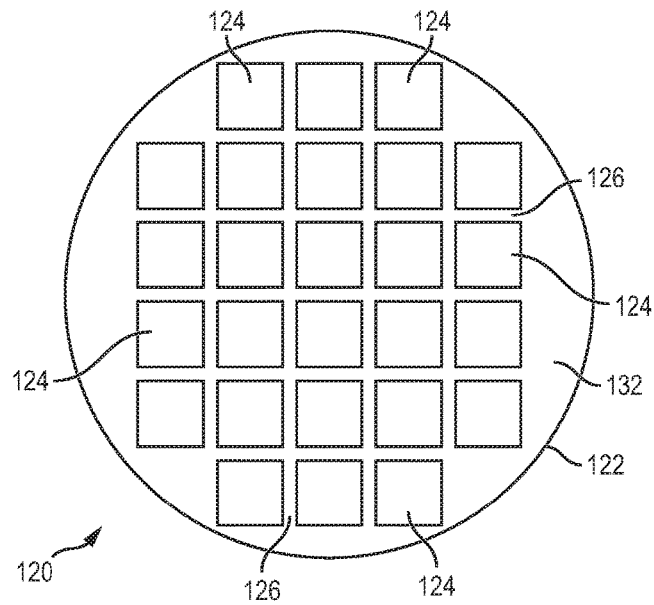
FIGS. 2a-2n illustrate a process of mounting GaN semiconductor die to an interconnect structure to form a GaN semiconductor package.
Figure 2B:
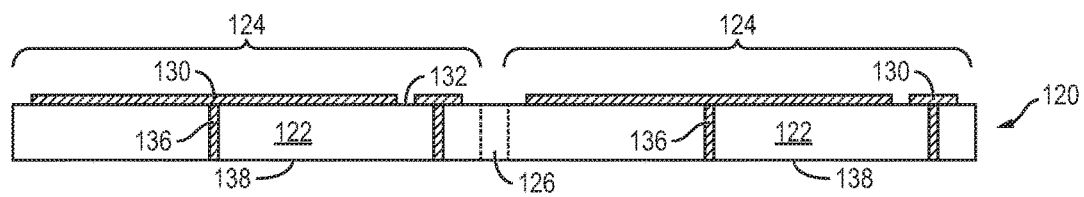
Figure 2C:
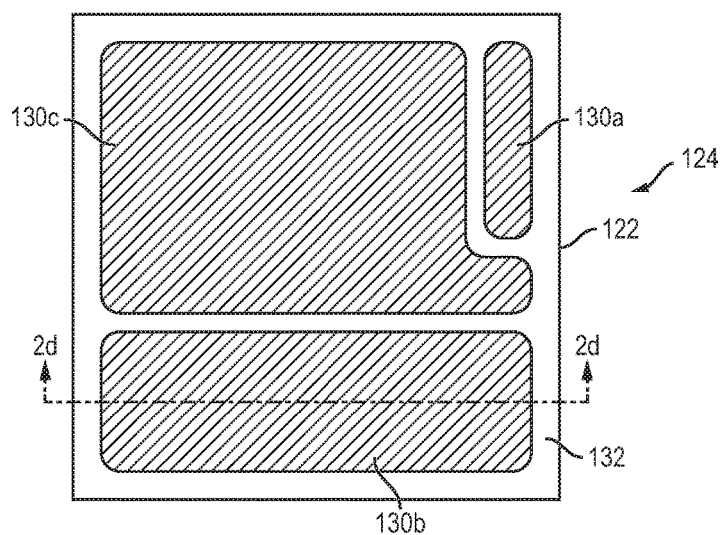
Figure 2D:
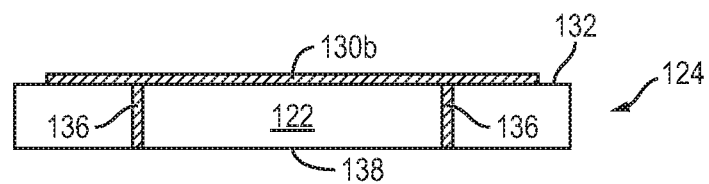
Figure 2E:
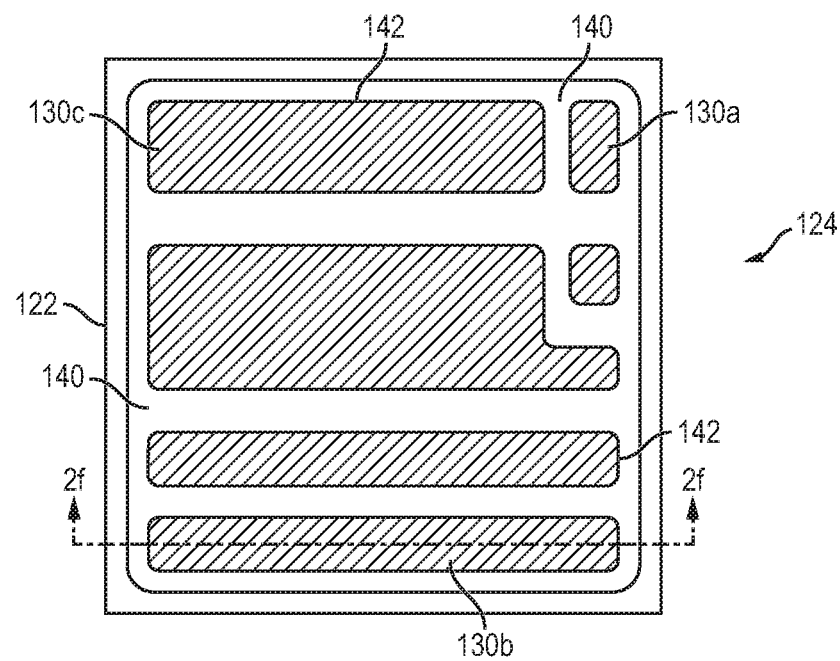
Figure 2F:
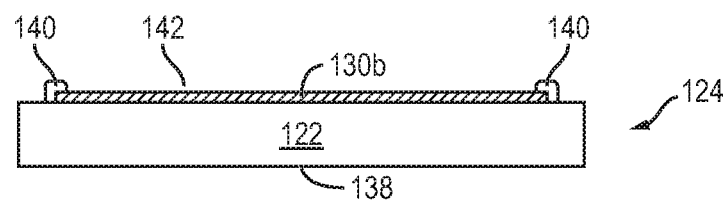
Figure 2G:
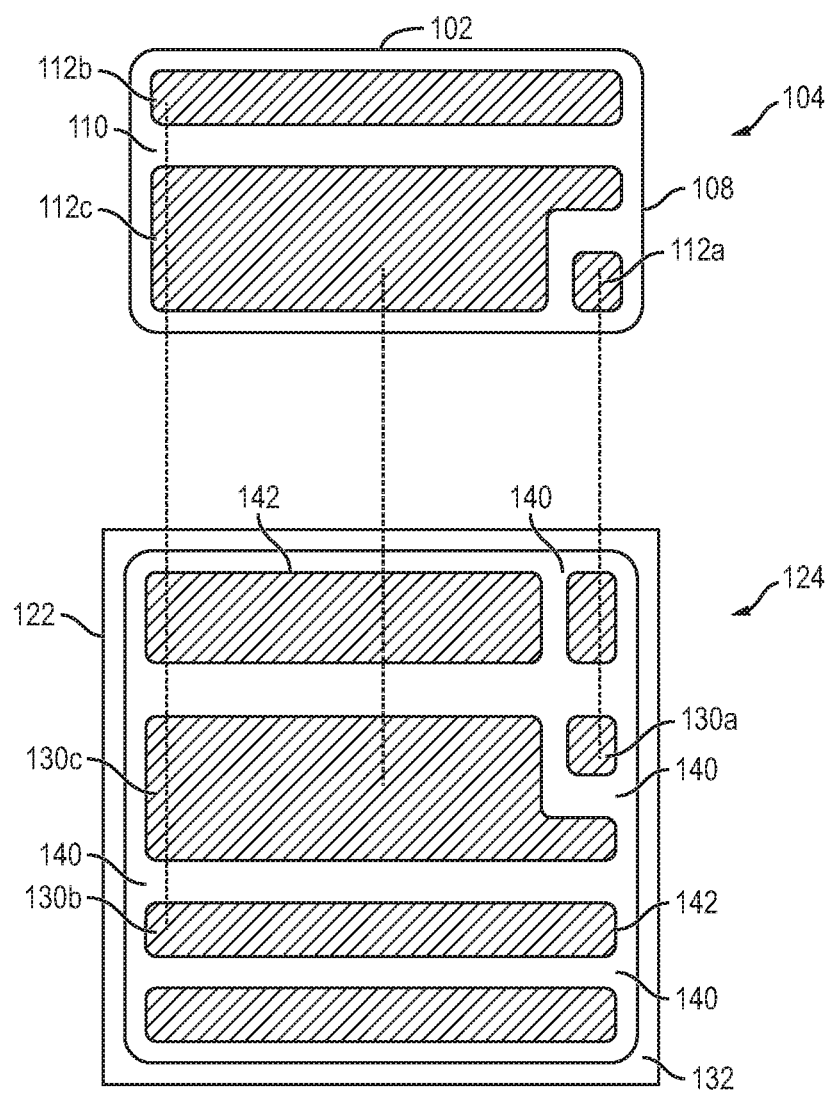
Figure 2H:
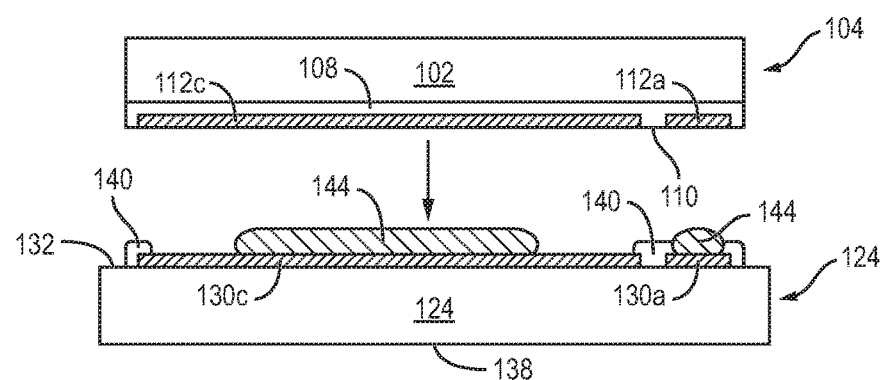
Figure 2I:
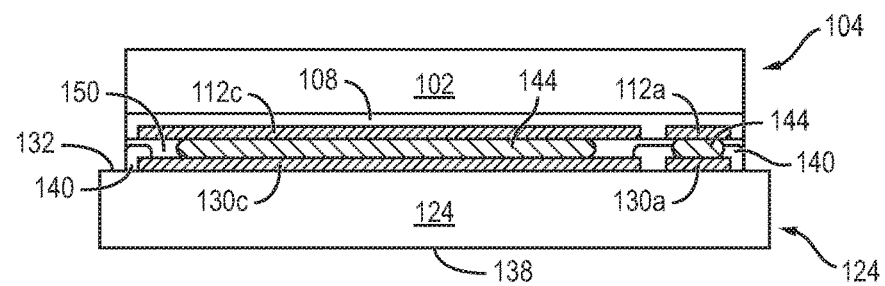
Figure 2J:
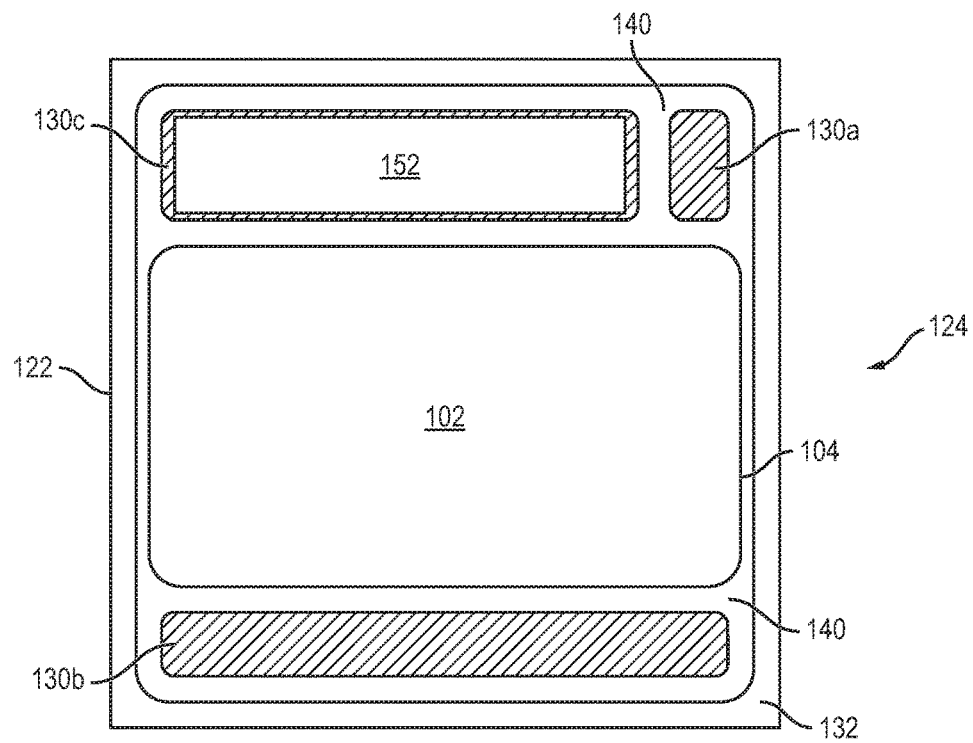
Figure 2K:
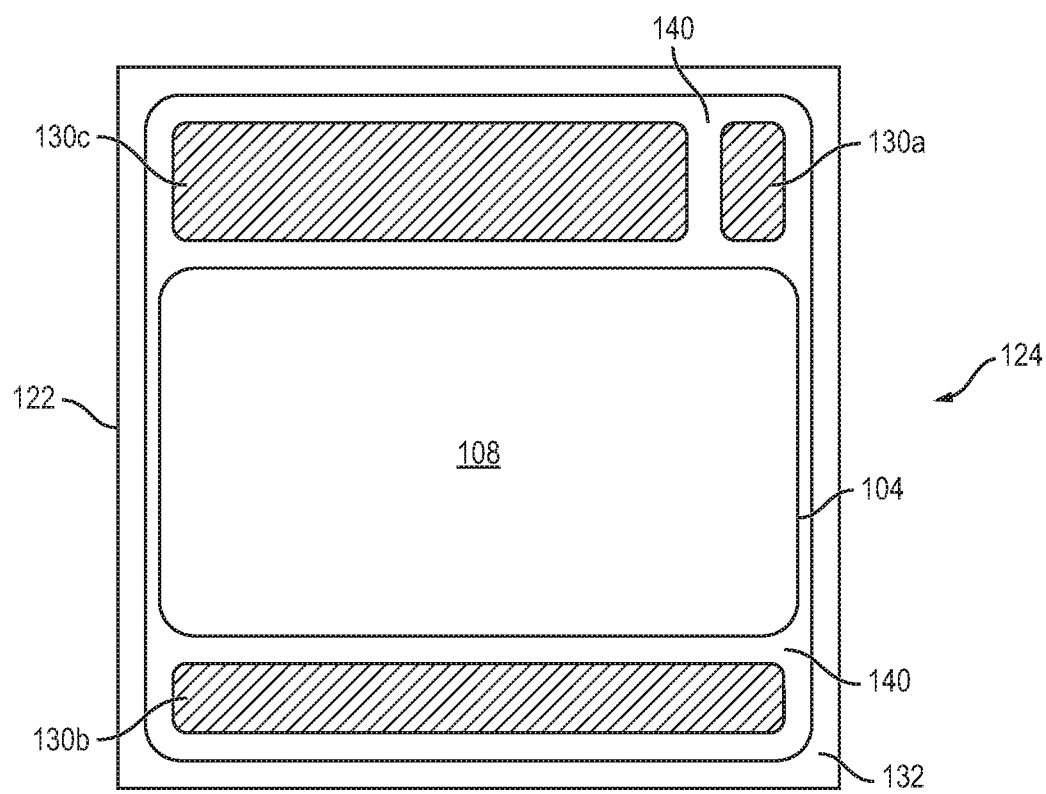
Figure 2L:
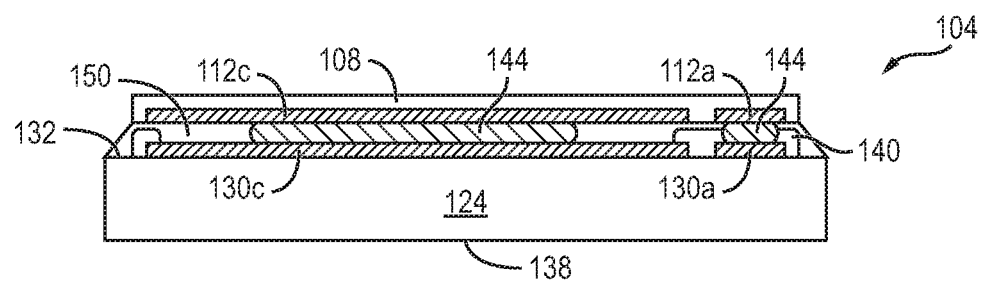
Figure 2M:
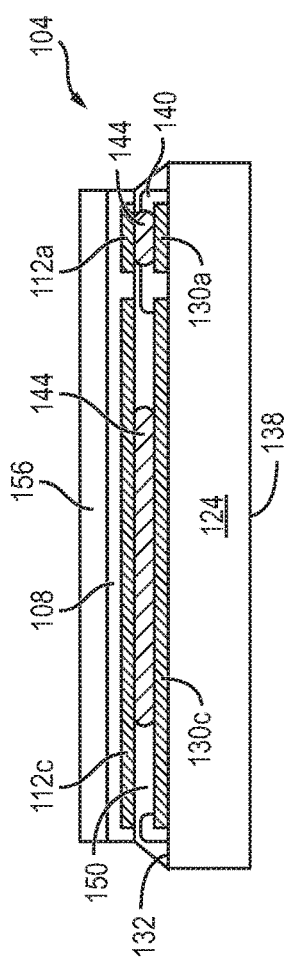
Figure 2N:
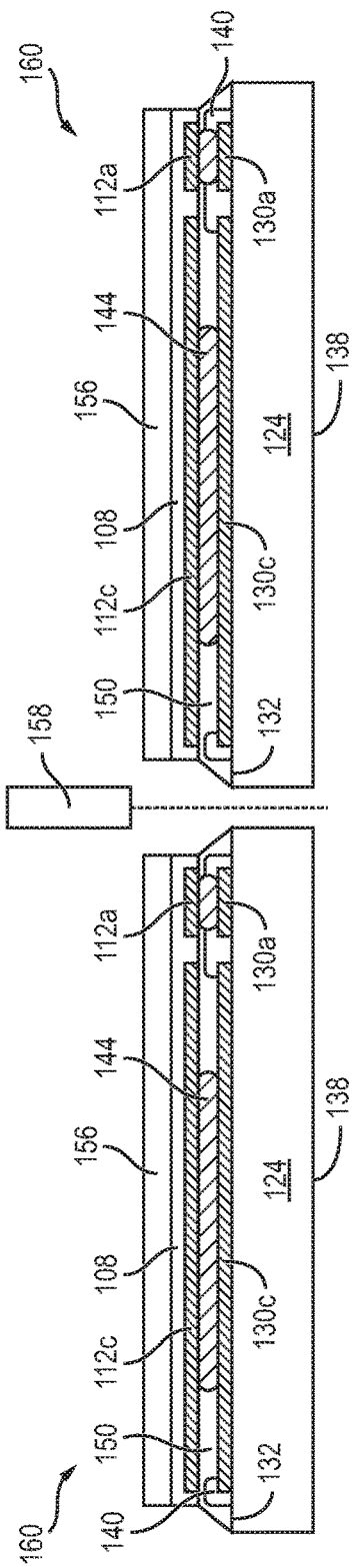

FIGS. 2a-2n show a process of disposing GaN semiconductor die 104 on an interconnect structure to form a GaN semiconductor package. FIG. 2a illustrates an interconnect wafer or substrate 120 with a base substrate material 122, such as Si, AlN, ceramic, or other bulk material for structural support. Alternatively, base substrate material 122 contains one or more layers of insulating material, such as silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBC)), polymer, ceramic, or other dielectric material having similar structural and insulating properties. Interconnect substrate or structure 120 includes a plurality of interconnect die attach areas 124 separated by saw street 126. Each interconnect die attach area 124 provides electrical interconnect for GaN semiconductor die 104. In one embodiment, interconnect substrate 120 has a width or diameter of 100-450 mm and thickness of about 760 μm. In another embodiment, interconnect substrate 120 can be a leadframe.

FIG. 2b shows a cross-sectional view of a portion of interconnect substrate 120, including base substrate material 122. A conductive layer 130 is formed over surface 132 using a patterning and metal deposition process such as sputtering, electrolytic plating, or electroless plating. Conductive layer 130 can be one or more layers of Al, Cu, Sn, Ni, Au, Ag, or other suitable electrically conductive material. Portions of conductive layer 130 can be electrically common or electrically isolated for electrical routing depending on the design and function of GaN semiconductor die 104. Base substrate material 122 can support active devices on surface 132. Conductive vias 136 can be formed through base substrate material 122 for electrical interconnect to opposing surface 138 of interconnect die attach area 124.

FIG. 2c shows a plan view of one interconnect die attach area 124, still part of interconnect substrate 120, with the patterned conductive layer 130 having electrically isolated portions 130a, 130b, and 130c. Interconnect die attach area 124 can have active regions or inactive regions on surface 132 with Si base substrate material 122. In one embodiment, conductive vias 136 can be formed through base substrate material 122 for electrical interconnect to opposing surface 138 of interconnect die attach area 124, as shown in FIG. 2d of a cross-sectional view through line 2d-2d of FIG. 2c.

In FIG. 2e, an insulating or passivation layer 140 is formed over interconnect die attach areas 124 and conductive layer 130 using PVD, CVD, printing, lamination, spin coating, spray coating, sintering or thermal oxidation. The insulating layer 140 contains one or more layers of SiO2, Si3N4, SiON, Ta2O5, Al2O3, HfO2, BCB, PI, PBO, polymer, or other dielectric material having similar structural and insulating properties. The patterned conductive layer 130 with electrically isolated portions 130a, 130b, and 130c is exposed from openings 142 formed in insulating layer 140. FIG. 2f shows a cross-sectional view of openings 142 in insulating layer 140 through line 2f-2f of FIG. 2e formed by an etching process or laser direction ablation (LDA) to expose portions of conductive layer 130.

In FIG. 2g, GaN semiconductor die 104 from FIGS. 1a-1c, with base substrate material 102 for structural support, is positioned over interconnect die attach areas 124 of interconnect substrate 120 using a pick and place operation with active surface 110 oriented toward surface 132 of the interconnect die attach area. More specifically, conductive layer 112a as connected to the gate region of the power MOSFET in GaN semiconductor die 104 is aligned with conductive layer 130a of interconnect die attach area 124, conductive layer 112b corresponding to the drain region of the power MOSFET in GaN semiconductor die 104 is aligned with conductive layer 130b, and conductive layer 112c corresponding to the source region of the power MOSFET in GaN semiconductor die 104 is aligned with conductive layer 130c, as shown in FIG. 2h. Interconnect die attach areas 124 remains part of interconnect substrate 120.

An electrically conductive material 144 is deposited over conductive layer 130 or conductive layer 112 using an evaporation, electrolytic plating, electroless plating, ball drop, or screen printing process. Conductive material 144 can be Al, Sn, Ni, Au, Ag, Pb, Bi, Cu, solder, and combinations thereof, with an optional flux solution. For example, conductive material 144 can be eutectic Sn/Pb, high-lead solder, or lead-free solder. GaN semiconductor die 104 is brought into bonding position with interconnect die attach area 124. In one embodiment, conductive material 144 is reflowed by heating the material above its melting point to metallurgically and electrically bond conductive layers 112a-112c of GaN semiconductor die 104 to conductive layers 130a-130c of interconnect die attach area 124, respectively. Conductive material 144 can also be compression bonded or thermocompression bonded to conductive layers 112 and 130. In another embodiment, conductive layers 112a-112c are metallurgically and electrically connected to conductive layers 130a-130c using a conductive paste.

FIG. 2i shows GaN semiconductor die 104, with base substrate material 102 for structural support, disposed on interconnect die attach area 124 and metallurgically and electrically bonded with conductive material 144. As an advantage, the electrical connections between GaN semiconductor die 104 and interconnect die attach area 124 are internal to the components structure. Interconnect die attach areas 124 remain in interconnect structure form during the GaN semiconductor die attach. Base substrate material 102 provides structural support for GaN semiconductor die 104 during the die attach process. An underfill material 150, such as an epoxy or polymer dielectric, is dispensed between GaN semiconductor die 104 and interconnect die attach area 124 while in interconnect substrate form to fully support the GaN semiconductor die. Underfill material 150 can be dispensed by wicking with gas pressure to outer surfaces of GaN semiconductor die 104 for support.

FIG. 2j shows an embodiment with another active device 152, such as Si FET, bonded to conductive layer 130c for additional signal processing. For example, active device 152 allows GaN semiconductor die 104 to operate in deletion mode (D-mode), see description of FIGS. 4a-4b.

In FIG. 2k, base substrate material 102 is removed from GaN semiconductor die 104 to expose the GaN semiconductor material 108, while in interconnect substrate form, by plasma etching or chemical etching, e.g. fluorine (SF6, NF3) plasma etch or xenon difluoride etch. Note that base substrate material 102 is removed after attachment of GaN semiconductor die 104 to interconnect die attach area 124. Base substrate material 102 provides support of GaN semiconductor die 104 for previous manufacturing processes. FIG. 2l shows a cross-sectional view of GaN semiconductor die 104 mounted to interconnect die attach area 124, without base substrate material 102. Interconnect die attach area 124 and underfill 150 provide support for GaN semiconductor die 104 during subsequent manufacturing processes.

In FIG. 2m, a protective layer 156, such as polyimide (PI), is formed over GaN semiconductor die 104 while in interconnect substrate form. Protection layer 156 provides additional environment isolation for GaN semiconductor die 104. Protection layer 156 can also be photo patterned to expose metal interconnection layers.

In FIG. 2n, interconnect substrate 120 is singulated through saw street 126 using a saw blade or laser cutting tool 158 into individual GaN semiconductor packages 160. Alternatively, interconnect substrate 120 is singulated by plasma etching. Plasma etching has advantages of forming precision side surfaces along saw streets 126, while retaining the structure and integrity of the base substrate material.

In another embodiment, base substrate material 102 can be removed from GaN semiconductor die 104 post interconnect structure singulation by plasma etching or chemical etching, e.g. SF6 or NF3 plasma etch or xenon difluoride etch.

Figure 3A:
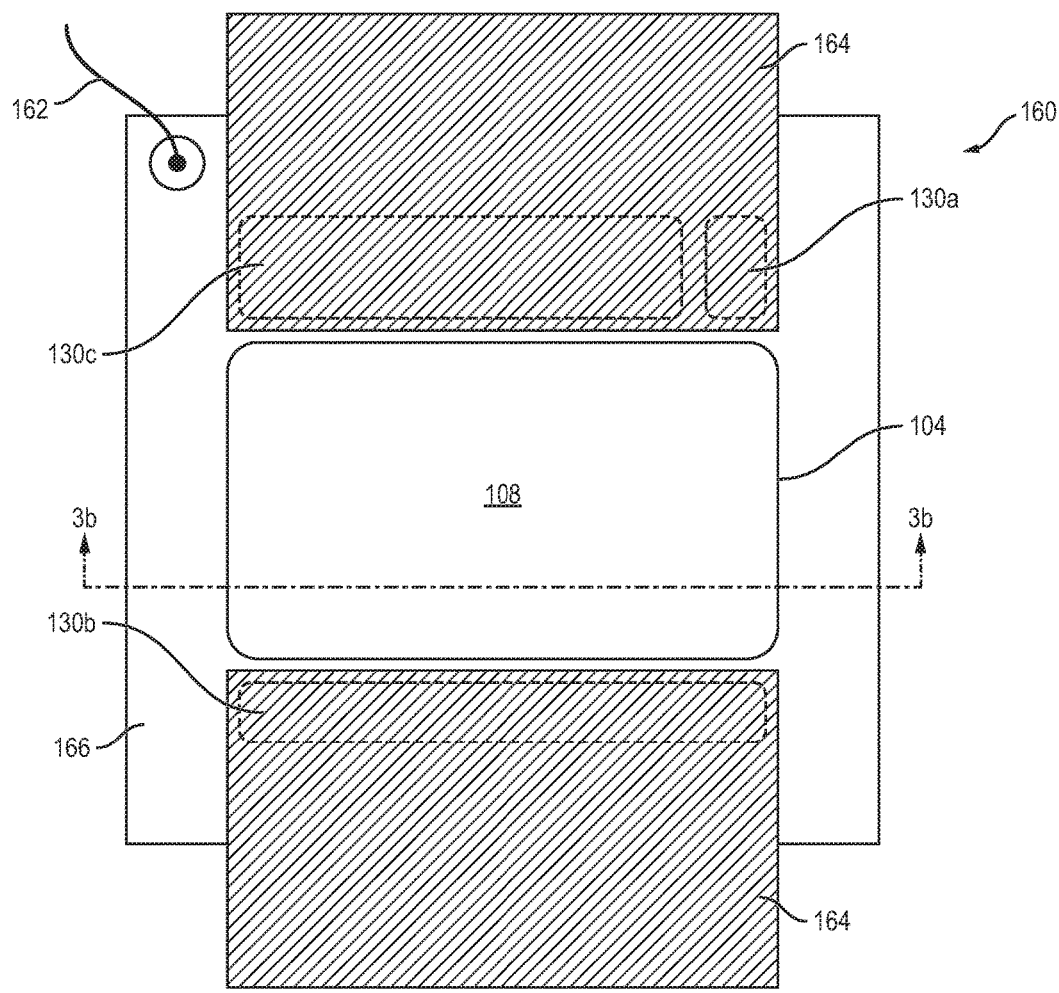
FIGS. 3a-3b illustrate the GaN semiconductor package with the GaN semiconductor die mounted to the interconnect die attach area.
Figure 3B:
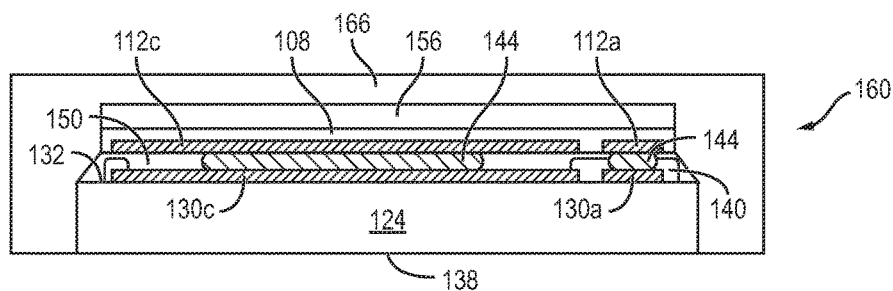

FIGS. 3a-3b show GaN semiconductor package 160 post interconnect structure singulation and post removal of base substrate material 102. Bond wires 162 can be bonded to conductive layers 130a-130c through openings in insulating layer 140. Alternatively, interconnect clips 164 are bonded to conductive layers 130a-130c. Bond wires 162 and interconnect clips 164 provide external interconnect for the gate region, drain region, and source region of the power MOSFET in GaN semiconductor die 104.

FIG. 3b shows a cross-sectional view through line 3b-3b of FIG. 3a with encapsulant or molding compound 166 deposited over GaN semiconductor package 160 using a paste printing, compressive molding, transfer molding, liquid encapsulant molding, vacuum lamination, film-assisted molding, spin coating, or other suitable applicator. Encapsulant 166 can be polymer composite material, such as epoxy resin with filler, epoxy acrylate with filler, or polymer with proper filler. Encapsulant 166 is non-conductive, provides physical support, and environmentally protects the semiconductor device from external elements and contaminants.

Base substrate material 102 provides structural support for safe handling of the ultra-thin GaN semiconductor die 104 during the above described integration and manufacturing processes. The removal of Si base material after integration of GaN semiconductor die 104 on die attach area 124 and, in particular after GaN die attach, enables use of a lower cost, lower stress GaN semiconductor die. GaN semiconductor die 104 exhibits a high breakdown voltage while maintaining an ultra-thin profile with the support of base substrate material 102 during die attach.

Figure 4A:
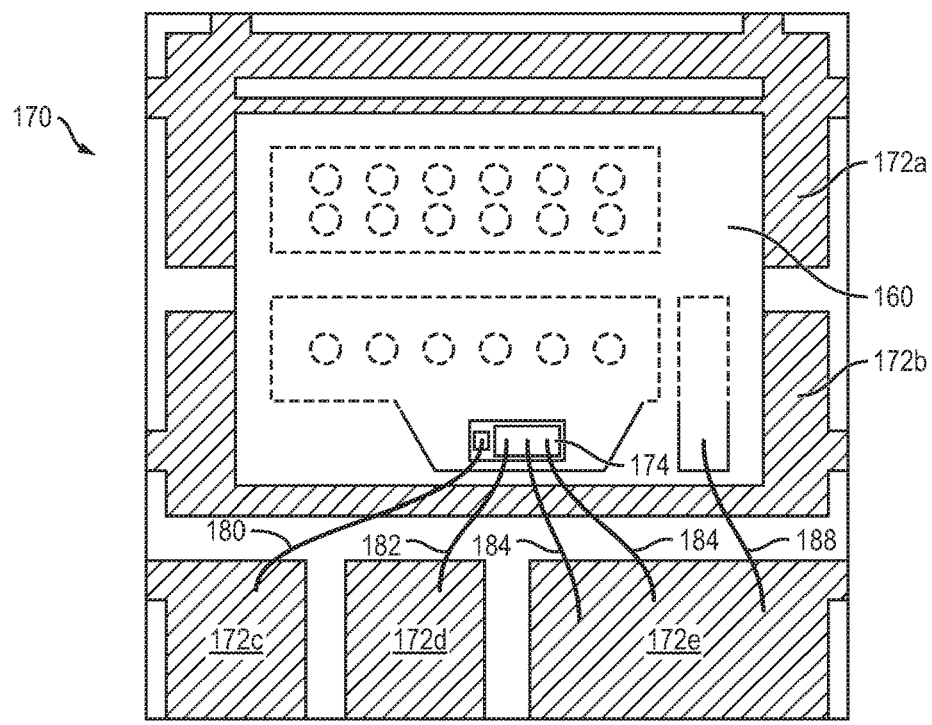
FIGS. 4a-4b illustrate an embodiment of the GaN semiconductor package disposed on an interconnect substrate with a semiconductor die for depletion mode (D-mode) operation.
Figure 4B:
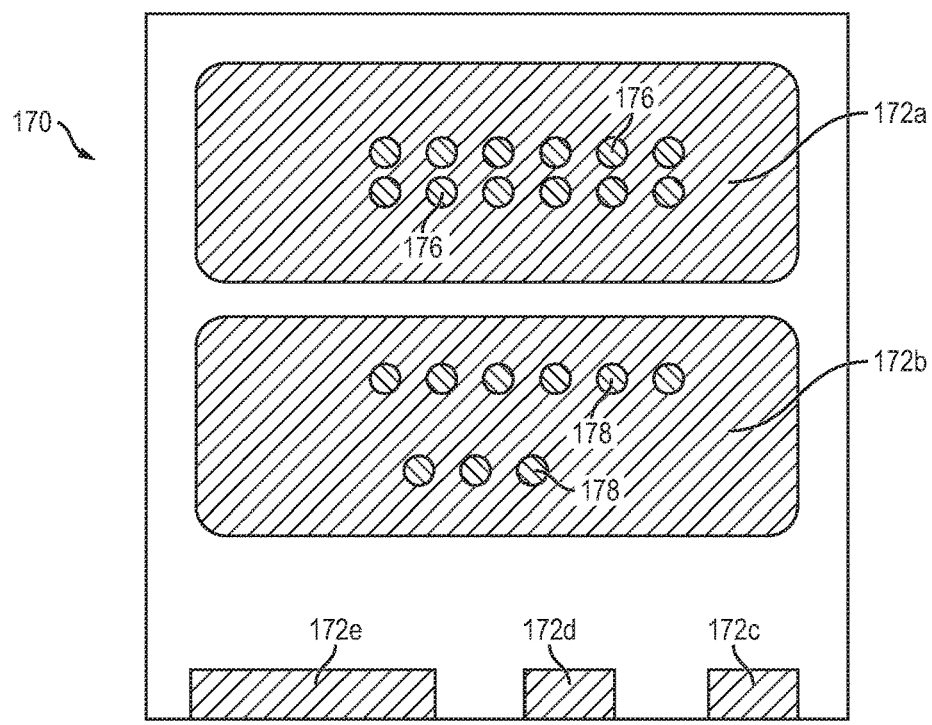

FIGS. 4a-4b show top and bottom views of GaN semiconductor package 160 mounted to interconnect substrate 170. Conductive layers 172a, 172b, 172c, 172d, and 172e are formed over interconnect substrate 170 as a leadframe, see FIG. 4a. Semiconductor die 174 is disposed on GaN semiconductor package 160. A first electrical connection is made from the drain region of GaN semiconductor die 104 through conductive layer 130b and conductive via 176 formed through interconnect structure base material 122 to conductive layer 172a, see FIG. 4b. A second electrical connection is made from the source region of GaN semiconductor die 104 through conductive layer 130c and conductive via 178 formed through interconnect structure base material 122 to conductive layer 172b. A third electrical connection is made from semiconductor die 174, e.g. gate region, through bond wire 180 to conductive layer 172c. A fourth electrical connection is made from semiconductor die 174, e.g. source region, through bond wire 182 to conductive layer 172d as the kelvin terminal. A fifth electrical connection is made from semiconductor die 174, e.g. source region, through bond wire 184 to conductive layer 172e. A sixth electrical connection is made from the gate region of GaN semiconductor die 104 through conductive layer 130a and bond wire 188 to conductive layer 172e. The drain region of semiconductor die 174 connects from the backside of the semiconductor die to the source region of GaN semiconductor die 104 through conductive layer 130b. FIGS. 4a-4b show GaN semiconductor die 104 operating in D-mode with a cascode configuration of interconnect substrate 170 to allow semiconductor die 174 to enable and disable the overall device as the GaN semiconductor die is always enabled. Alternately, GaN semiconductor die 104 can be operated in enhancement mode (E-mode).

While one or more embodiments have been illustrated and described in detail, the skilled artisan will appreciate that modifications and adaptations to those embodiments may be made without departing from the scope of the present disclosure.

What is claimed is:

1. A method of making a semiconductor device, comprising:
    providing a first semiconductor substrate including a first semiconductor material;
    providing a second semiconductor substrate including a second semiconductor material and a die attach area;
    forming a conductive layer on a surface of the second semiconductor substrate extending from within the die attach area to outside the die attach area;
    forming an insulating layer over the conductive layer with a first opening in the insulating layer within the die attach area and a second opening in the insulating layer outside the die attach area;
    singulating the first semiconductor substrate to provide a semiconductor die;
    disposing the semiconductor die within the die attach area of the second semiconductor substrate, wherein the semiconductor die is electrically connected to the conductive layer through the first opening in the insulating layer; and
    removing a portion of the first semiconductor material from the semiconductor die.

2. The method of claim 1, wherein the first semiconductor material includes silicon.

3. The method of claim 1, wherein the second semiconductor material includes gallium nitride or aluminum gallium nitride.

4. The method of claim 1, further including singulating the second semiconductor substrate.

5. The method of claim 1, further including depositing a material between the semiconductor die and the die attach area of the second semiconductor substrate.

6. The method of claim 1, wherein the second semiconductor substrate includes an active region.

7. A method of making a semiconductor device, comprising:
    providing a semiconductor die including a semiconductor material;
    providing an interconnect substrate including a die attach area;
    forming a conductive layer on a surface of the interconnect substrate extending from within the die attach area to outside the die attach area;
    forming an insulating layer over the conductive layer;
    disposing the semiconductor die within the die attach area of the interconnect substrate, wherein the semiconductor die is electrically connected to the conductive layer through a first opening in the insulating layer; and
    removing a portion of the semiconductor material from the semiconductor die.

8. The method of claim 7, wherein the semiconductor material includes silicon.

9. The method of claim 7, further including forming a second opening in the insulating layer outside the die attach area.

10. The method of claim 7, further including singulating the interconnect substrate.

11. The method of claim 7, further including depositing a material between the semiconductor die and the die attach area of the interconnect substrate.

12. The method of claim 7, wherein the interconnect substrate includes an active region.

13. The method of claim 7, further including forming a protective layer over the semiconductor die.

14. A method of making a semiconductor device, comprising:
    providing a semiconductor die including a semiconductor material;
    providing an interconnect substrate including a die attach area;
    forming a conductive layer on the interconnect substrate extending from within the die attach area;
    forming an insulating layer over the conductive layer; and
    disposing the semiconductor die within the die attach area of the interconnect substrate, wherein the semiconductor die is disposed over the die attach area of the interconnect substrate and electrically connected to the conductive layer through a first opening in the insulating layer.

15. The method of claim 14, wherein the semiconductor material includes silicon.

16. The method of claim 14, further including forming a second opening in the insulating layer outside the die attach area.

17. The method of claim 14, further including depositing a material between the semiconductor die and the die attach area of the interconnect.

18. The method of claim 14, wherein the interconnect substrate includes an active region.

19. The method of claim 14, further including forming a protective layer over the semiconductor die.

20. The method of claim 14, further including removing a portion of the semiconductor material from the semiconductor die.

* * * * *

UNITED STATES PATENT AND TRADEMARK OFFICE
CERTIFICATE OF CORRECTION

PATENT NO. : 10,090,199 B2
APPLICATION NO. : 15/446281
DATED : October 2, 2018
INVENTOR(S) : Gordon M. Grivna and Stephen St. Germain Page 1 of 1

It is certified that error appears in the above-identified patent and that said Letters Patent is hereby corrected as shown below:

In the Claims

Claim 17, Column 8, Line 40, delete "the interconnect."; insert --the interconnect subtrate.--

Signed and Sealed this
Twenty-seventh Day of November, 2018

Andrei Iancu
*Director of the United States Patent and Trademark Office*